United States Patent
Ota et al.

(10) Patent No.: US 10,917,972 B2
(45) Date of Patent: Feb. 9, 2021

(54) SWITCHING DEVICE AND ELECTRONIC DEVICE

(71) Applicants: Kabushiki Kaisha Toshiba, Tokyo (JP); Toshiba Electronic Devices & Storage Corporation, Tokyo (JP)

(72) Inventors: Hiroshi Ota, Misato Saitama (JP); Hirofumi Omote, Adachi Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/560,160

(22) Filed: Sep. 4, 2019

(65) Prior Publication Data
US 2020/0267840 A1  Aug. 20, 2020

(30) Foreign Application Priority Data
Feb. 14, 2019  (JP) .................................. 2019-024803

(51) Int. Cl.
*H05K 1/18*    (2006.01)
*H01L 25/11*   (2006.01)
*H01L 23/055*  (2006.01)

(52) U.S. Cl.
CPC .......... *H05K 1/181* (2013.01); *H01L 23/055* (2013.01); *H01L 25/117* (2013.01); *H05K 2201/09072* (2013.01); *H05K 2201/10166* (2013.01); *H05K 2201/10515* (2013.01); *H05K 2201/10568* (2013.01)

(58) Field of Classification Search
USPC ......................................................... 361/761
See application file for complete search history.

(56) References Cited

U.S. PATENT DOCUMENTS 6,777,798 B2    8/2004  Fukumoto et al.
2016/0079156 A1*  3/2016  Liu ................... H01L 23/49562
                                          257/675

FOREIGN PATENT DOCUMENTS

JP    H02-229461 A    9/1990
JP    2002-305284 A  10/2002
JP    2012-038925 A   2/2012

* cited by examiner

*Primary Examiner* — Andargie M Aychillhum
(74) *Attorney, Agent, or Firm* — White & Case LLP

(57) ABSTRACT

According to one embodiment, a switching device includes a first switching element, a second switching element, and a holder. The first switching element includes a plurality of terminals. The second switching element includes a plurality of terminals and is provided apart from the first switching element in a thickness direction of the first switching element. The holder includes a holding member, a connection portion, and a conductor. The holding member is provided with a cavity to contain the first switching element. The cavity includes a bottom portion between the first switching element and the second switching element. The connection portion is provided on the holding member to face the cavity and is electrically connected to the second switching element. The conductor connects the connection portion and the terminals of the first switching element. The first switching element and the second switching element are connected in parallel.

9 Claims, 8 Drawing Sheets

US 10,917,972 B2

SWITCHING DEVICE AND ELECTRONIC DEVICE

CROSS-REFERENCE TO RELATED APPLICATIONS

This application is based upon and claims the benefit of priority from Japanese Patent Application No. 2019-024803, filed Feb. 14, 2019, the entire contents of which are incorporated herein by reference.

FIELD

Embodiments described herein relate generally to a switching device and an electronic device.

BACKGROUND

There is known an electronic device including a circuit board and switching elements mounted on the circuit board.

In such a type of structure, it may be advantageous when a new structure with less inconvenience, such as simplification and downsizing of the structure, is achieved.

DETAILED DESCRIPTION

Figure 1:
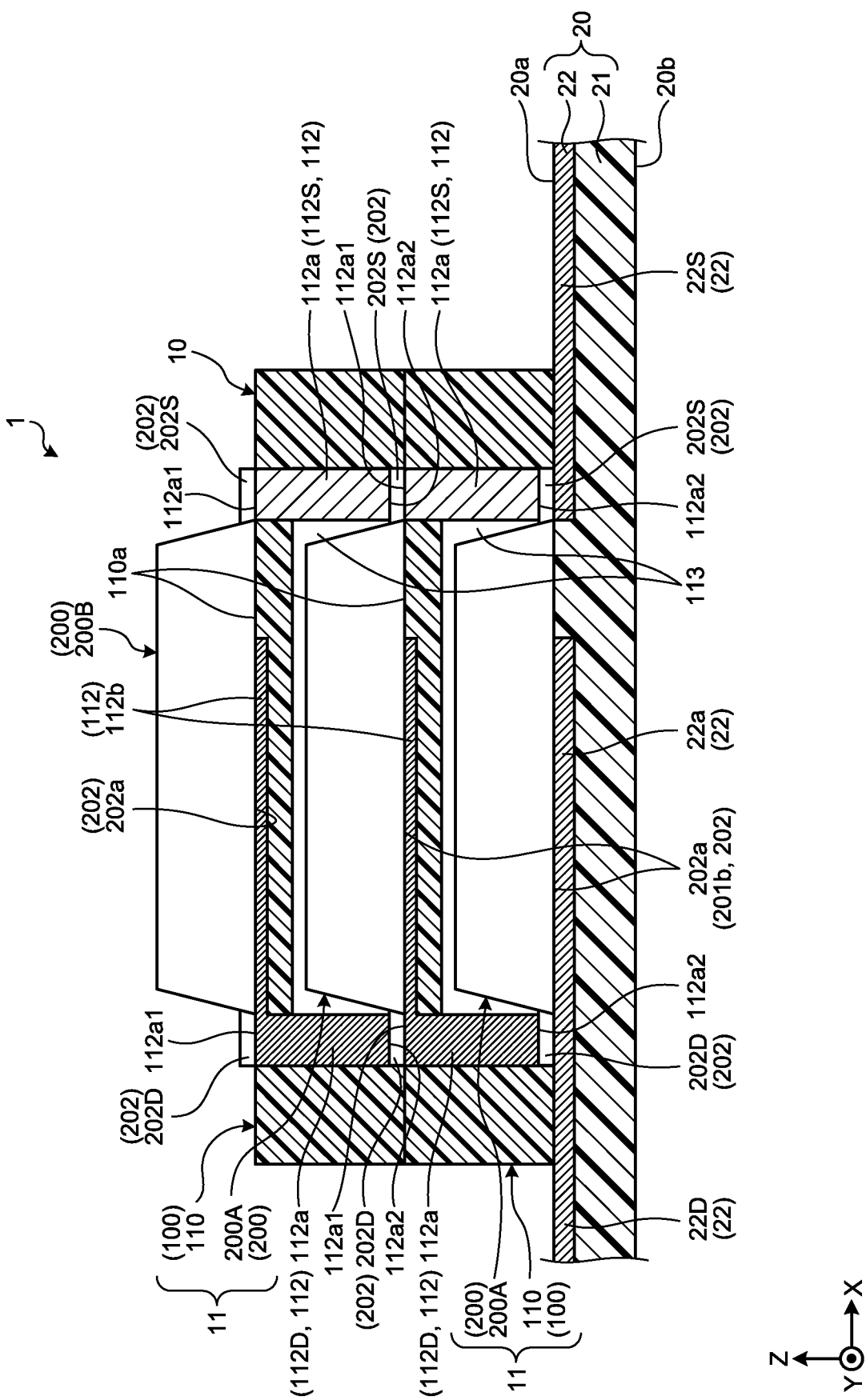
FIG. 1 is an exemplary and schematic cross-sectional view of part of an electronic device of a first embodiment.

In general, according to one embodiment, a switching device includes a first switching element, a second switching element, and a holder. The first switching element includes a plurality of terminals. The second switching element includes a plurality of terminals and is provided apart from the first switching element in a thickness direction of the first switching element. The holder includes a holding member, a connection portion, and a conductor. The holding member is provided with a cavity to contain the first switching element. The cavity includes a bottom portion between the first switching element and the second switching element. The connection portion is provided on the holding member to face the cavity and is electrically connected to the second switching element. The conductor connects the connection portion and the terminals of the first switching element. The first switching element and the second switching element are connected in parallel.

Hereinafter, exemplary embodiments of a switching device and an electronic device will be disclosed. Configurations (technical features) of the embodiments to be illustrated hereinafter are examples.

In addition, the embodiments to be exemplified hereinafter include similar components. Hereinafter, those similar components will be denoted by the common reference numeral, and redundant descriptions thereof will be omitted in some cases. In addition, in the present specification, ordinal numbers are assigned for the sake of convenience in order to distinguish components and the like, and do not indicate the priority or order.

Note that directions of thickness of circuit boards 20 and 20A, holding members 110 and 110A, and switching elements 200 are the same, and are illustrated with an arrow Z in each drawing. Hereinafter, the arrow Z will be referred to as a direction Z or simply the thickness direction. In addition, the direction Z is a stacking direction of the holding members 110 and 110A and is a stacking direction of the switching elements 200. The direction indicated by the arrow Z is a direction opposite to an opening direction of a cavity 113 of the holding member 110 or 110A. Directions X and Y orthogonal to each other along surfaces of the circuit board 20 are illustrated for the sake of convenience of the description. The direction X, the direction Y, and the direction Z are orthogonal to each other.

First Embodiment

FIG. 1 is a cross-sectional view of part of an electronic device 1. As illustrated in FIG. 1, the electronic device 1 includes a switching device 10 and the circuit board 20. The electronic device 1 is, for example, an inverter device, but is not limited thereto.

The circuit board 20 is, for example, a printed wiring board such as a glass epoxy board. The circuit board 20 is a rigid board. The circuit board 20 has an insulator 21 and conductors 22. The circuit board 20 has a flat plate-like shape, and has a front surface 20a and a back surface 20b. Part of each conductor 22 is exposed on the front surface 20a. The conductors 22 provided on the circuit board 20 are insulated from each other by the insulator 21. Each conductor 22 is made of, for example, a conductive metal material such as a copper-based material. The circuit board 20 may be a flexible board.

The switching device 10 is mounted on the front surface 20a of the circuit board 20 by soldering, for example. In the present embodiment, the switching device 10 may be referred to as a surface-mount component. Solder (not illustrated) used in the soldering is an example of a conductive bonding material.

The switching device 10 includes the switching elements 200 and a holder 100 holding the switching elements 200. In the switching device 10, the switching elements 200 are connected in parallel. Conductors 112 connecting the switching elements 200 in parallel are provided in the switching device 10, that is, in the holder 100. Each conductor 112 is made of, for example, a conductive metal material such as a copper-based material.

The holder 100 includes the holding members 110. The holding members 110 holding the switching elements 200 are stacked in the switching device 10. The electronic device 1 may be structured by mounting the switching device 10, in which the holders 100 and the switching elements 200 are assembled, on the circuit board 20. Alternatively, the switching device 10 and the electronic device 1 may be structured by sequentially mounting the holders 100 and the switching elements 200 on the circuit board 20.

Figure 2:
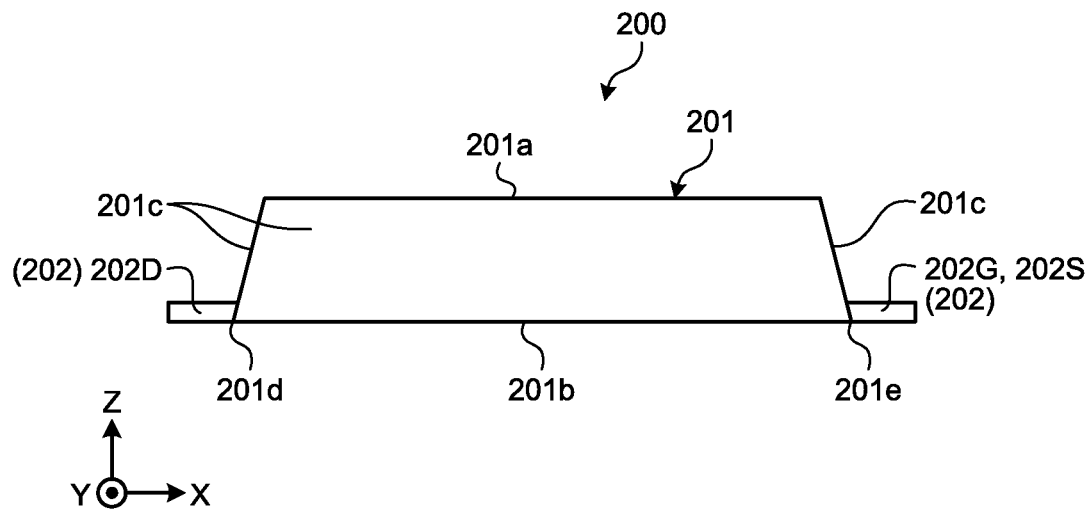
FIG. 2 is an exemplary and schematic side view of a switching element included in a switching device of the embodiment.
Figure 3:
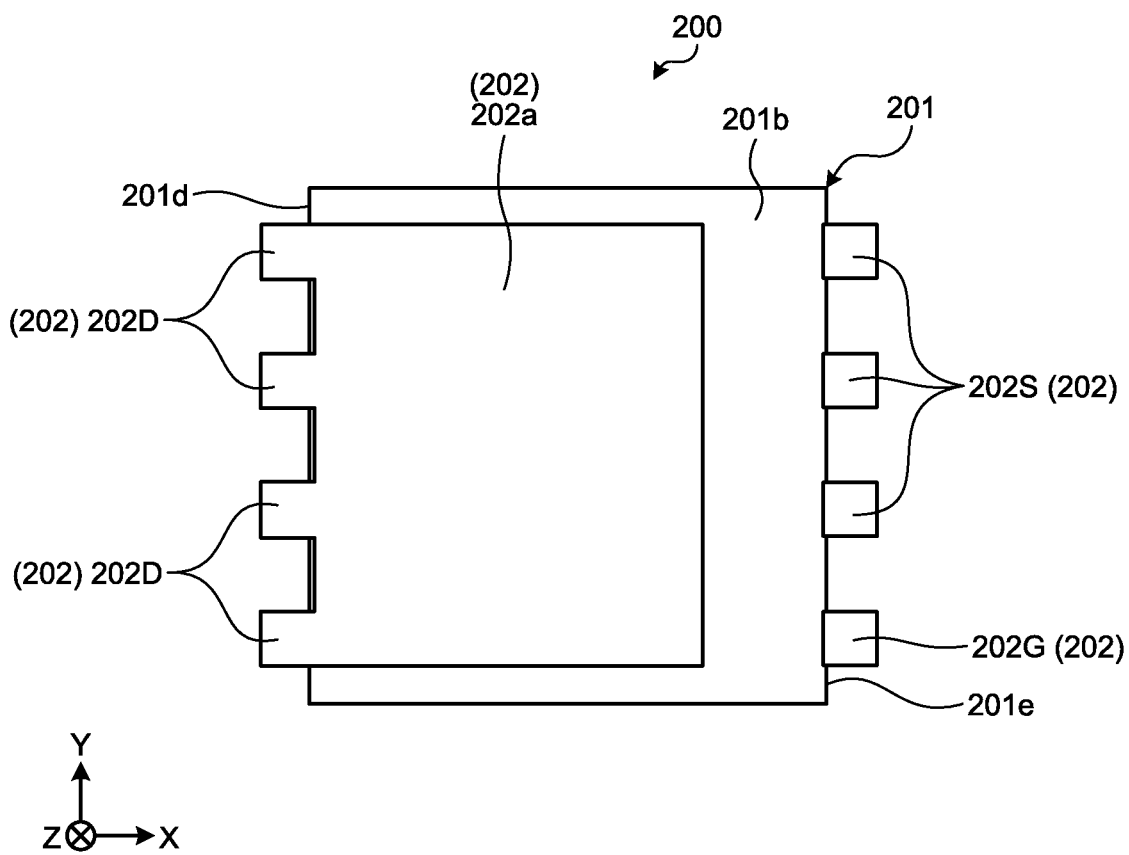
FIG. 3 is an exemplary and schematic plan view of the switching element included in the switching device of the embodiment.

FIG. 2 is a side view of the switching element 200 included in the switching device 10. FIG. 3 is a plan view of the switching element 200.

The switching element 200 is, for example, a metal-oxide semiconductor field-effect transistor (MOS-FET). The switching element 200 includes a body 201 and a plurality of terminals 202.

The body 201 has a flat quadrangular frustum shape, and has a quadrangular appearance such as a trapezoid in the side view illustrated in FIG. 2. In addition, the body 201 has a rectangular appearance such as a square in a plan view illustrated in FIG. 3. The body 201 has a top surface 201$a$, a back surface 201$b$, and side surfaces 201$c$. The top surface 201$a$ and the back surface 201$b$ are parallel to each other. The back surface 201$b$ is larger than the top surface 201$a$. The side surfaces 201$c$ have slopes extending between the top surface 201$a$ and the back surface 201$b$. A direction orthogonal to the top surface 201$a$ and the back surface 201$b$ is the thickness direction (the direction Z) of the switching element 200. The body 201 includes an insulating layer, a conductor layer, and a semiconductor layer. The body 201 is not limited to one having the quadrangular frustum shape, and may have another shape such as a flat quadrangular prism shape, a flat rectangular parallelepiped shape, or a quadrangular plate shape.

As illustrated in FIG. 3, the switching element 200 includes a gate terminal 202G, a source terminal 202S, and a drain terminal 202D as the plurality of terminals 202. Those terminals 202 are provided on the side surfaces 201$c$ of the body 201. In the present embodiment, the four drain terminals 202D are arranged apart from each other along a side 201$d$ of the back surface 201$b$ of the body 201. The three source terminals 202S and the single gate terminal 202G are arranged apart from each other along a side 201$e$ opposite to the side 201$d$. The plurality of terminals 202 protrude from each side surface 201$c$ in a direction that is along the back surface 201$b$ and that intersects and is orthogonal to the sides 201$d$ and 201$e$. The terminals 202 have contact surfaces that almost parallel the back surface 201$b$. The back surface 201$b$ is provided with a quadrangular pad 202$a$. The four drain terminals 202D are electrically connected by the pad 202$a$. In other words, the four drain terminals 202D and the pad 202$a$ constitute a common electrode (common terminal). In the switching element 200, when a predetermined voltage is applied to the gate terminal 202G by an operation of a driver (not illustrated), the source terminal 202S and the drain terminal 202D are electrically connected. The terminal 202 is made of, for example, a conductive metal material such as a copper-based material. The pad 202$a$ may be referred to as a terminal or an electrode.

Figure 4:
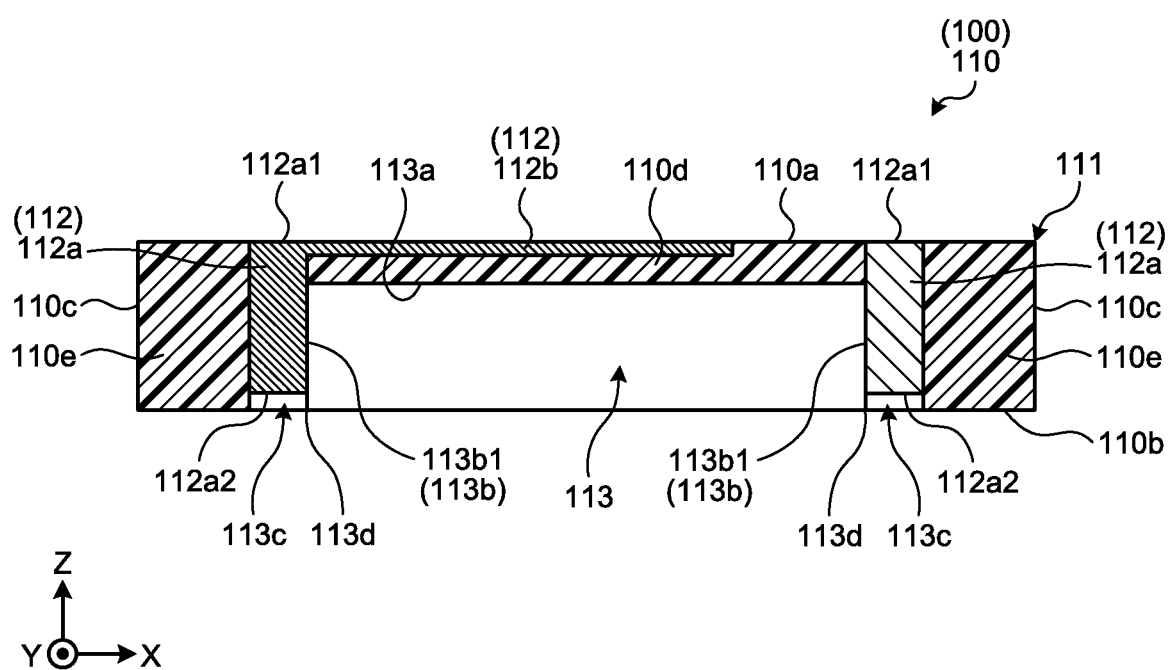
FIG. 4 is an exemplary and schematic cross-sectional view of a holding member included in a holder of the switching device of the embodiment at the same position as FIG. 1.
Figure 5:
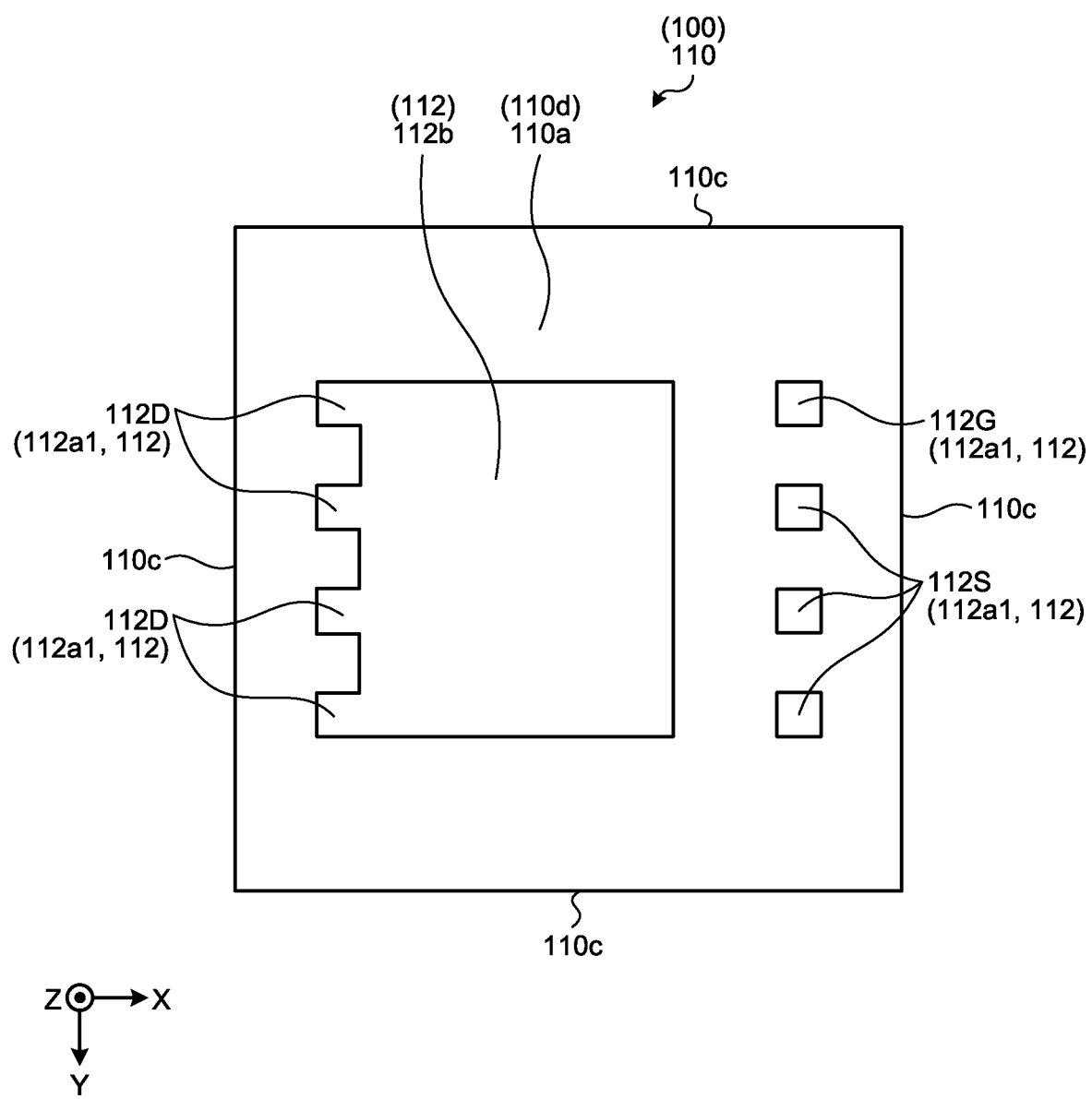
FIG. 5 is an exemplary and schematic top view of the holding member included in the holder of the switching device of the embodiment.
Figure 6:
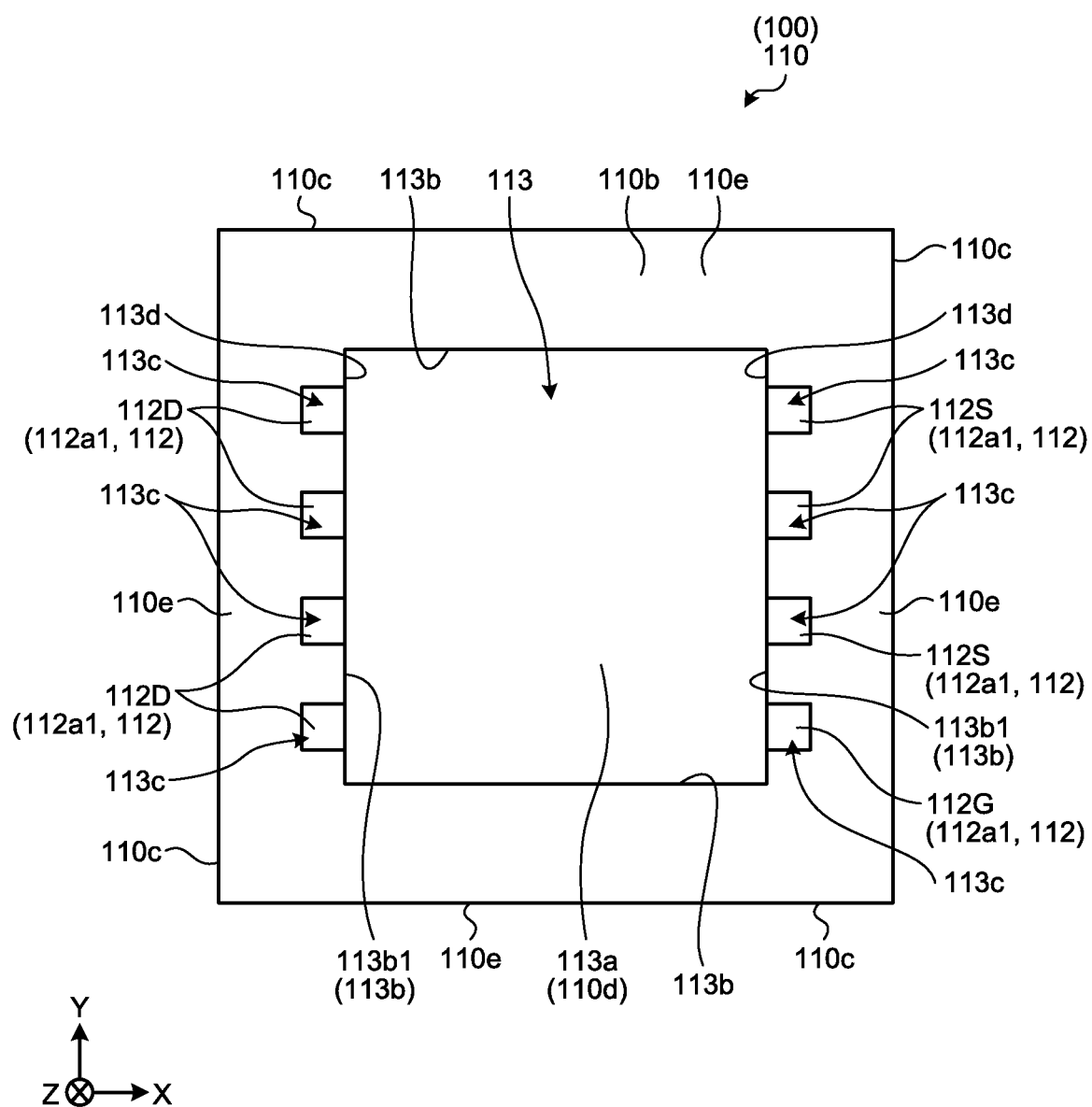
FIG. 6 is an exemplary and schematic bottom view of the holding member included in the holder of the switching device of the embodiment.

FIG. 4 illustrates a cross-sectional view of the holding member 110 included in the holder 100 at the same position as FIG. 1. FIG. 5 illustrates a top view of the holding member 110. FIG. 6 illustrates a bottom view of the holding member 110.

As illustrated in FIGS. 4 to 6, the holding member 110 has a quadrangular plate shape. The holding member 110 has an upper surface 110$a$, a lower surface 110$b$, and side surfaces 110$c$. The upper surface 110$a$ and the lower surface 110$b$ are parallel to each other. Each side surfaces 110$c$ extend between the upper surface 110$a$ and the lower surface 110$b$ to intersect and be orthogonal to the upper surface 110$a$ and the lower surface 110$b$. A direction orthogonal to the upper surface 110$a$ and the lower surface 110$b$ is the thickness direction (the direction Z) of the holding member 110. Note that the holding member 110 is not limited to one having the quadrangular plate shape.

As illustrated in FIGS. 4 and 6, the holding member 110 is provided with the cavity 113. The cavity 113 is a recessed portion whose depth extends in the direction Z from a center of the lower surface 110$b$. In other words, the recessed portion is open in an opposite direction to the direction Z. A bottom surface 113$a$ and four side surfaces 113$b$ face the cavity 113. The bottom surface 113$a$ intersects and is orthogonal to the direction Z. Each of the four side surfaces 113$b$ extends in the direction Z, and is arranged in a quadrangular shape in the plan view as illustrated in FIG. 6. The holding member 110 provided with the cavity 113 includes a bottom wall 110$d$ and a peripheral wall 110$e$. The holding member 110 has a flat box shape that is open in the direction opposite to the direction Z. The bottom surface 113$a$ is an example of the "bottom portion" of the cavity.

As illustrated in FIGS. 4 and 6, four conductors 112 are arranged apart from each other along each of a pair of the side surfaces 113$b$1 that face the cavity 113 and oppose each other. As illustrated in FIG. 4, penetrating portions 112$a$ of the conductor 112 penetrate through the holding member 110 in the direction Z at a total of eight locations illustrated in FIG. 6. The penetrating portion 112$a$ is exposed in the direction Z and the direction opposite to the direction Z. Although the penetrating portion 112$a$ is exposed inside the cavity 113 on the side surface 113$b$1, it is not necessarily to be exposed inside the cavity 113.

As illustrated in FIG. 4, a lower end 112$a$2 of each of the penetrating portion 112$a$ is exposed in the direction opposite to the direction Z and faces the direction opposite to the direction Z in a recessed portion 113$c$ having one step in the direction Z from the lower surface 110$b$ of the holding member 110. The recessed portion 113$c$ is a notch provided in an edge 113$d$, which is a boundary between the lower surface 110$b$ of the holding member 110 and the side surface 113$b$1 of the cavity 113. The recessed portion 113$c$ is open in the direction opposite to the direction Z and also open in a direction intersecting and orthogonal to the side surface 113$b$1, that is, the direction X or a direction opposite to the direction X.

Upper ends 112$a$1 of the eight penetrating portions 112$a$ are exposed in the direction Z on the upper surface 110$a$ of the holding member 110 and face the direction opposite to the direction Z as illustrated in FIG. 5. The upper surface 110$a$ is provided with a quadrangular pad 112$a$ connected to the four upper ends 112$a$1 positioned on the left side of FIG. 5. The four upper ends 112$a$1 and the one pad 112$a$ constitute one terminal. The pad 112$a$ may be referred to as a terminal or an electrode.

The holding member 110 is, for example, a printed wiring board such as a glass epoxy board, and is a rigid board. The conductors 112 provided in the holding member 110 are insulated from each other by an insulator 111. The conductor 112 including the penetrating portion 112$a$ and the pad 112$a$ can be formed by a known method of manufacturing a printed wiring board.

Figure 7:
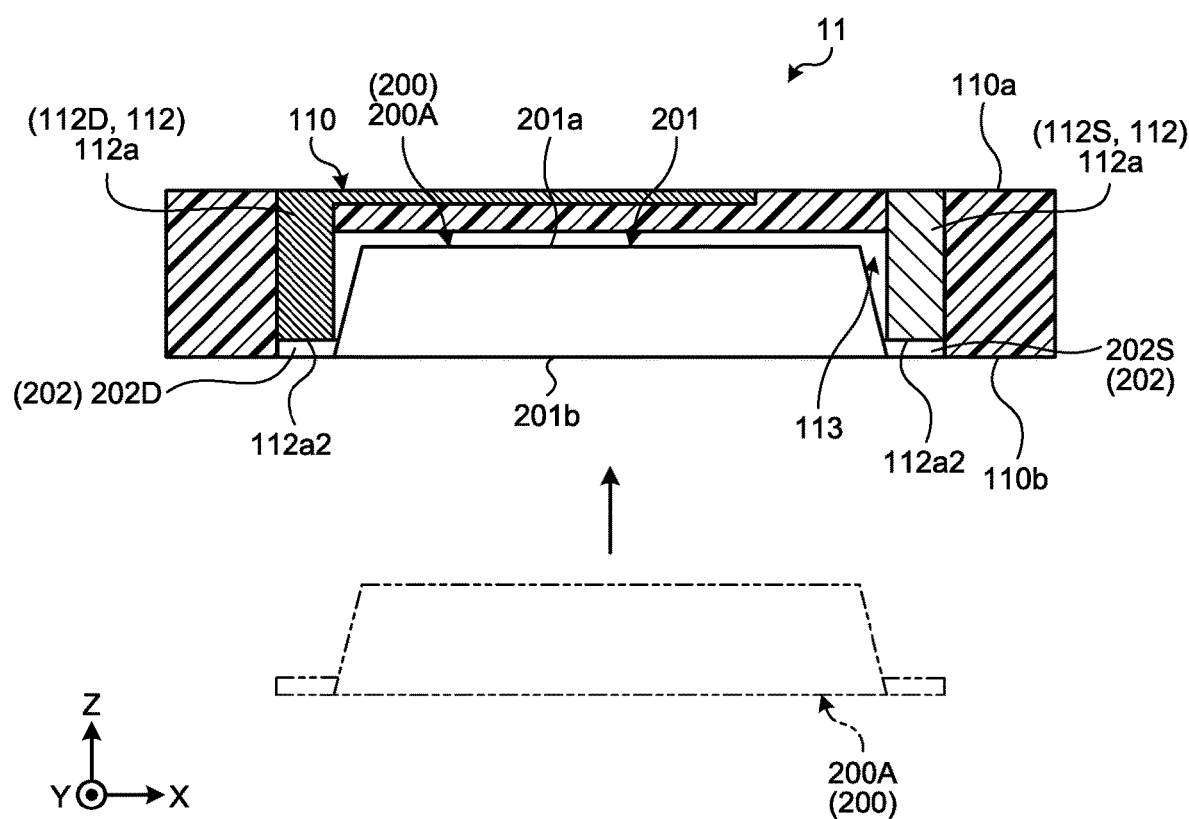
FIG. 7 is an exemplary and schematic cross-sectional view of a subassembly of the switching element and the holding member included in the switching device of the embodiment at the same position as FIG. 1.
Figure 8:
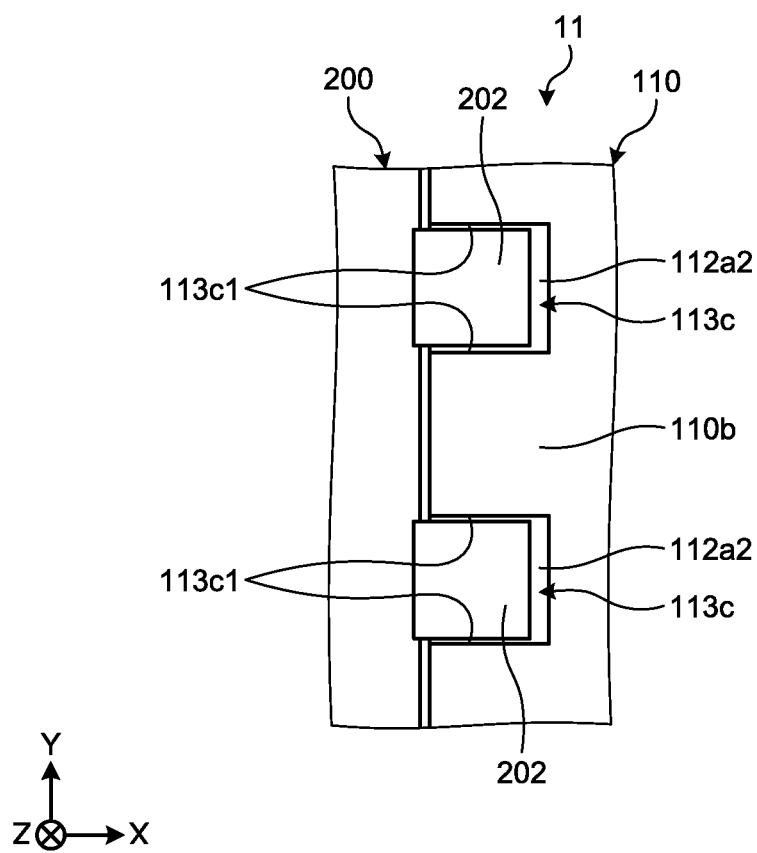
FIG. 8 is a plan view of part of the subassembly of the switching element and the holding member included in the switching device of the embodiment.

FIG. 7 is a cross-sectional view of a subassembly 11 of the switching device 10 at the same position as FIG. 1. FIG. 8 is a plan view (a bottom view) of part of the subassembly 11. The subassembly 11 illustrated in FIG. 7 includes a single holding member 110 and a single switching element 200A. The switching element 200A is attached to the holding member 110 in a state where the body 201 of the switching element 200A is contained in the cavity 113, thereby constituting the subassembly 11. In the cavity 113, the switching element 200A is contained with a posture where the top surface 201a is close to the upper surface 110a of the holding member 110 and the back surface 201b is close to the lower surface 110b of the holding member 110. In other words, the posture is a posture where the top surface 201a faces the direction Z and the back surface 201b faces the direction opposite to the direction Z. In the subassembly 11, the top surface 201a faces the bottom surface 113a of the cavity 113, and the side surfaces 201c face the side surfaces 113b of the cavity 113, respectively. The back surface 201b is flush with the lower surface 110b of the holding member 110, and exposed from the cavity 113 in the direction opposite to the direction Z. In addition, the back surface 201b faces the direction opposite to the direction Z. The switching element 200A included in the subassembly 11 is an example of the "first switching element".

Each of the terminals 202 of the switching element 200 is contained in the corresponding recessed portion 113c. In other words, the recessed portion 113c is provided to correspond to the terminal 202. In a state of temporary placement before mounting of the switching element 200, the terminal 202 is restricted from moving in a direction along the lower surface 110b by the side surface 113c1 of the recessed portion 113c as illustrated in FIG. 8, and the terminal 202 is restricted from moving in the direction Z by the lower end 112a2 of the penetrating portion 112a as illustrated in FIG. 7. That is, the side surface 113c1 and the lower end 112a2 function as a positioning mechanism at the time of temporary placement. The lower end 112a2 may be referred to as a bottom surface of the recessed portion 113c.

Each of the terminals 202 is bonded to the lower end 112a2 of the penetrating portion 112a (the conductor 112), which is exposed at the bottom of the recessed portion 113c, in the state of being contained in the recessed portion 113c by an electrical and mechanical bonding method such as soldering.

As illustrated in FIG. 3, the terminals 202 of the switching element 200 includes the three source terminals 202S, the single gate terminal 202G, and the four drain terminals 202D. The conductor 112 of the holding member 110 includes three source conductors 112S, one gate conductor 112G, and four drain conductors 112D as illustrated in FIG. 5. In the subassembly 11 illustrated in FIG. 7, the source terminal 202S and the source conductor 112S are electrically connected, and the drain terminal 202D and the drain conductor 112D are electrically connected. Although not illustrated in FIG. 7, the gate terminal 202G and the gate conductor 112G are electrically connected.

As illustrated in FIG. 1, the two subassemblies 11 are stacked on the circuit board 20 in the switching device 10. Further, a switching element 200B, different from the switching element 200 contained in the cavity 113, is mounted on the holding member 110 (the subassembly 11) positioned at an end in the Z direction. Specifications of the switching element 200B are the same as specifications of the switching element 200A, but the both may be different. It is possible to set various mounting orders and procedures of the switching element 200 and the holding member 110 in the switching device 10. The switching element 200B is an example of a "second switching element".

In each of the holding members 110, the upper end 112a1 and the pad 112b exposed on the upper surface 110a of the holding member 110, and the terminal 202 of the switching element 200 positioned on the upper surface 110a face each other in the thickness direction. The upper end 112a1 and the pad 112b, and the terminal 202 are bonded by an electrical and mechanical bonding method such as soldering. As illustrated in FIG. 1, the source terminal 202S and the source conductor 112S are electrically connected, and the drain terminal 202D and the drain conductor 112D are electrically connected. Although not illustrated in FIG. 1, the gate terminal 202G and the gate conductor 112G are electrically connected. The pad 202a of the drain terminal 202D provided on the back surface 201b of the switching element 200 and the pad 112a of the drain conductor 112D provided on the upper surface 110a of the holding member 110 are bonded by, for example, an electrical and mechanical bonding method such as soldering. The upper surface 110a is an example of a surface of the bottom wall 110d opposite to the cavity 113, and the pad 112a is an example of the "connection portion".

In the switching device 10, the source terminals 202S in the switching elements 200 are electrically connected to each other via the source conductor 112S (the penetrating portion 112a) of the holding member 110 (the holder 100). The gate terminals 202G in the switching elements 200 are electrically connected to each other via the gate conductor 112G (the penetrating portion 112a) of the holding member 110. The drain terminals 202D in the switching elements 200 are electrically connected to each other via the drain conductor 112D (the penetrating portion 112a) of the holding member 110. With such a structure, the switching elements 200 are connected in parallel via the conductors 112 of the holding member 110 in the switching device 10. Each of the source conductor 112S, the gate conductor 112G, and the drain conductor 112D is configured, for example, as the penetrating portions 112a aligned in the thickness direction are bonded by the electrical and mechanical bonding method such as soldering.

At the circuit board 20 and the holding member 110 facing the circuit board 20, the front surface 20a of the circuit board 20 and the lower surface 110b of the holding member 110 face each other in the thickness direction, and the conductor 112 exposed to the lower surface 110b and the conductor 22 of the front surface 20a face each other in the thickness direction. The conductor 112 and the conductor 22 facing each other in the thickness direction are bonded by the electrical and mechanical bonding method such as soldering. As illustrated in FIG. 1, the source conductor 22S of the circuit board 20 and the source conductor 112S of the holding member 110 are electrically connected by using, for example, a conductive bonding material (not illustrated) such as solder and the source terminal 202S of the switching element 200 in the electronic device 1. The drain conductor 22D of the circuit board 20 and the drain conductor 112D of the holding member 110 are electrically connected via a conductive bonding material (not illustrated) and the drain terminal 202D of the switching element 200. A gate conductor (not illustrated) of the circuit board 20 and the gate conductor 112G of the holding member 110 (see FIGS. 5 and 6) are electrically connected via a conductive bonding material and the gate terminal 202G (see FIG. 3) of the switching element 200 although not illustrated in FIG. 1. A pad 22a of the drain conductor 22D provided on the front surface 20a of the circuit board 20 and the pad 202a of the drain terminal 202D provided on the back surface 201b of the switching element 200 are electrically and mechanically connected via a conductive bonding material (not illustrated). Although not illustrated, the three source conductors 112S are electrically and mechanically connected to the single source conductor 22S provided on the front surface 20a of the circuit board 20 via a conductive bonding material (not illustrated). The lower surface 110b of the holding member 110 may be referred to as a lower surface of the holder 100.

As described above, in the switching device 10 of the present embodiment, the switching element 200A (first switching element) and the switching element 200B (second switching element) are stacked in the thickness direction, and the conductors 112 of the holder 100 holding the switching elements 200 are electrically connected to the terminals 202 of the switching elements 200. According to such a structure, it is possible to form a circuit in which the switching elements 200 are connected in parallel by the conductors 112 (the penetrating portions 112a) extending in the thickness direction. If assuming that the switching elements 200 are arranged along the front surface 20a of the circuit board 20, the conductors connecting between the terminals 202 of the switching elements 200 are likely to lengthen along the front surface 20a, and three-dimensional crossing among the conductors is likely to be employed to ensure the insulation among the conductors, so that the wiring is more likely to lengthen, and also the structure of the wiring is likely to be more complicated. In this respect, the conductors 112 (conductive paths) connecting the terminals 202 of the switching elements 200 can be shortened by the amount of extension in the thickness direction in the switching device 10 of the present embodiment. In addition, since the conductors 112 are arranged in parallel to each other, the three-dimensional crossing of the conductors 112 is unnecessary. Therefore, according to such a structure, it is possible to shorten the length of the conductor 112, thereby obtaining advantages that an electrical resistance of the conductor 112 can be reduced, the mounting area of switching element 200 in the directions (the direction X and the direction Y) along the front surface 20a can be made smaller, and a parasitic inductor can be made smaller. In addition, it is possible that the number of paralleled switching elements 200 can be changed more easily by increasing or decreasing the number of the switching elements 200 and the holding members 110, that is, the number of the subassemblies 11.

In the present embodiment, the holder 100 includes the holding member 110 provided with the cavity 113 to contain the switching element 200A. According to such a structure, the holder 100 that holds the switching element 200A and has the conductor 112 can be realized with a relatively simple structure.

In the present embodiment, at least one holding member 110 included in the holder 100 has the upper surface 110a facing the switching element 200B on the opposite side of the cavity 113. The pad 112a (connection portion) provided on the upper surface 110a and the pad 202a of the drain terminal 202D (terminal) of the switching element 200B are bonded and electrically connected to each other. According to such a structure, the conductor electrically connected to and bonded to the pad 202a can be realized using the pad 112a with a relatively simple structure, even in the case where the pad 202a is provided on the back surface 201b of the switching element 200B.

In the present embodiment, the conductor 112 has the penetrating portion 112a (the conductor 112), which penetrates through the holding member 110 in the thickness direction and is exposed at both the ends in the thickness direction of the holding member 110. The upper end 112a1 and the lower end 112a2 of the penetrating portion 112a in the thickness direction and the terminal 202 of the switching element 200 overlap each other in the thickness direction and are electrically connected and bonded to each other. According to such a structure, a section of the conductor 112 extending in the direction intersecting the thickness direction can be reduced or shortened, thereby obtaining advantageous that a length of the conductor 112 can be made shorter, and a size of the switching device 10 in the direction intersecting the thickness direction can be made smaller.

In the present embodiment, the conductors 112 connecting the switching elements 200 in parallel can be realized as a relatively simple structure by electrically connecting the penetrating portions 112a aligned in the thickness direction when the holding members 110 having the same structure are stacked in the thickness direction. According to such a structure, it is possible to achieve a larger current flow without significantly increasing the mounting area and the wiring area in the planar direction.

In the present embodiment, when stacking the switching elements 200, each being the surface-mount type, in the thickness direction, it is unnecessary to form a shape of the switching element 200 in a shape dedicated to the stacking or to provide leads have different lengths among the switching elements 200. That is, according to the present embodiment, it is possible to realize a parallel circuit in which the switching elements 200 are stacked in the thickness direction with a relatively simple structure without particularly changing the shape of the surface-mount-type switching element 200.

In the present embodiment, the holding member 110 is the printed wiring board. According to such a structure, the holding member 110 and the holder 100 can be realized by a printed wiring board with a relatively simple structure.

Second Embodiment

Figure 9:
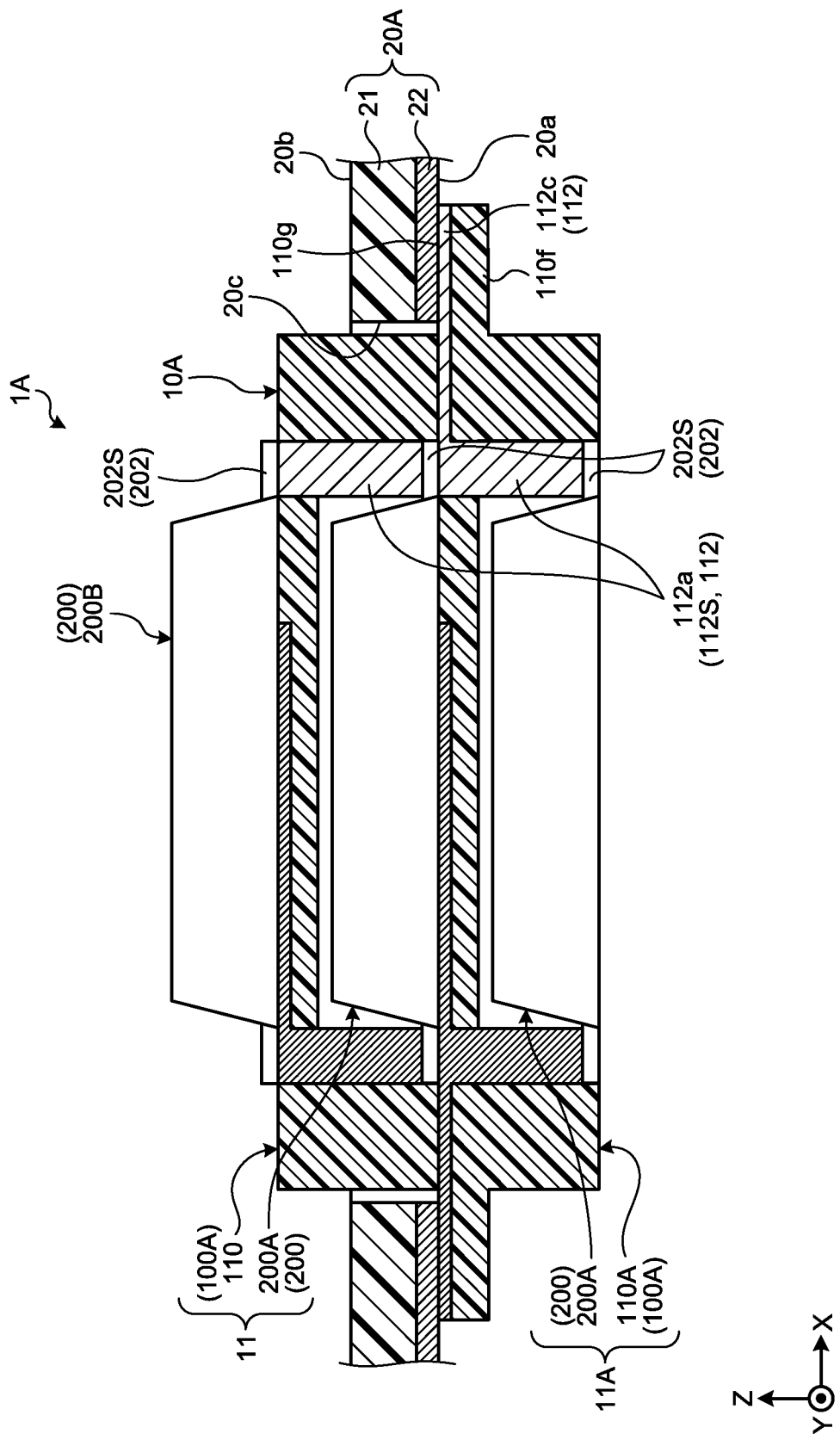
FIG. 9 is an exemplary and schematic cross-sectional view of part of an electronic device of a second embodiment.

FIG. 9 is a cross-sectional view of an electronic device 1A of the present embodiment. As illustrated in FIG. 9, a holder 100A includes the holding member 110A that abuts a circuit board 20A and the holding member 110 that does not abut the circuit board 20A. In the present embodiment, a structure of the holding member 110A is different from a structure of the holding member 110. The holding member 110A has a connection portion 110f connected to the circuit board 20A. The holding member 110 has the same structure as the holding member 110 of the first embodiment. The holding member 110A has the same structure as the holding member 110 except for the connection portion 110f.

The connection portion 110f has a flange-like shape overhanging from the peripheral wall 110e of the holding member 110. Note that the peripheral wall 110e is indicated in FIGS. 4 and 6. The connection portion 110f has a surface 110g abutting the front surface 20a of the circuit board 20. The surface 110g may be referred to as a contact surface or a supported surface. The surface 110g is provided with a connection pad 112c that is exposed in the thickness direction and that faces the conductor 22 of the circuit board 20. The connection pad 112c is part of the conductor 112 and may be referred to as a connection site. The conductor 22 and the connection pad 112c are electrically and mechanically connected by using, for example, a conductive bonding material (not illustrated) such as solder.

The circuit board 20A is provided with an opening 20c that contains at least part of the switching device 10A. The switching device 10A is mounted on the circuit board 20A in the state of penetrating through the opening 20c in the thickness direction. Since at least part of the switching device 10A is contained in the opening 20c provided in the circuit board 20A in this manner, a thickness (or height) of the electronic device 1A including the circuit board 20A and the switching device 10A can be reduced more. The opening 20c may be a recessed portion having a bottom, instead of a through-hole. In addition, specifications of the electronic device 1A, such as the structure of the connection portion 110f, and a position of the holding member 110A including the connection portion 110f in the switching device 10A can be appropriately changed and implemented.

In the present embodiment, the connection pad 112c (connection site) of the conductor 112 is provided at an intermediate position of the holder 100A in the thickness direction. Besides, a conductive path from the penetrating portion 112a of the conductor 112, that is, the conductor 22 of the circuit board 20 to the terminal 202 of the switching element 200 is provided on both sides of the connection pad 112c in the thickness direction. According to such a structure, it is possible to shorten a length of the conductor 112 (conductive path) from the conductor 22 to the terminal 202 of each of the switching elements 200, as compared with a structure in which the connection site of the conductor 112 with the conductor 22 of the circuit board 20 is provided at an end of the holder in the thickness direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A switching device comprising:
a first switch that includes a plurality of first terminals;
a second switch that includes a plurality of second terminals and is provided apart from the first switch in a thickness direction of the first switch; and
a first holder configured to hold the first switch, the first holder comprising
a first plate that faces an upper surface of the first switch,
a first pad that is provided on the first plate, and
a first pillar that connects to the first pad and faces a side surface of the first switch, the first pillar being provided on the first terminals, wherein the first pad and the first pillar comprise a conductive material, wherein the first switch and the second switch are connected in parallel, and wherein the first pillar and the first terminals overlap with each other in the thickness direction and are electrically connected and bonded.

2. The switching device according to claim 1, wherein the first pillar penetrates through the first holder in the thickness direction and is exposed at both ends in the thickness direction.

3. The switching device according to claim 1, further comprising a second holder that is stacked on the first holder in the thickness direction and has structure the same as that of the first holder.

4. The switching device according to claim 1, wherein the first holder is a printed wiring board.

5. The electronic device according to claim 1, further comprising a second holder that is stacked on the first holder, the second holder comprising
a second plate facing an upper surface of the second switch,
a second pad that is provided on the second plate, and
a second pillar connects to the second pad and faces a side surface of the second switch.

6. The electronic device according to claim 5, wherein the second pad and the second pillar comprise the conductive material.

7. The electronic device according to claim 1, wherein the first holder is provided with a cavity to contain the first switch.

8. An electronic device comprising:
a switching device that includes a first switch that includes a plurality of first terminals; a second switch that includes a plurality of second terminals and is provided apart from the first switch in a thickness direction of the first switch; and a first holder configured to hold the first switch, the first holder comprising a first plate that faces an upper surface of the first switch, a first pad that is provided on the first plate, and a first pillar that connects to the first pad and faces a side surface of the first switch, the first pillar being provided on the first terminals, the first pad and the first pillar comprising a conductive material, the first switching element and the second switching element being connected in parallel, the first pillar and the first terminals overlap with each other in the thickness direction and are electrically connected and bonded; and a circuit board on which the switching device is mounted.

9. The electronic device according to claim 8, wherein the circuit board is provided with an opening that contains part of the switching device.

* * * * *